(12) United States Patent
McKinnon

(10) Patent No.: US 6,462,544 B1
(45) Date of Patent: Oct. 8, 2002

(54) MAGNETIC RESONANCE IMAGING APPARATUS

(75) Inventor: Graeme McKinnon, Hartland, WI (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/695,506

(22) Filed: Oct. 24, 2000

(51) Int. Cl.[7] .................................................. G01V 3/00
(52) U.S. Cl. ....................................... 324/309; 324/307
(58) Field of Search ................................ 324/309, 307, 324/311, 318, 320, 300; 128/653

(56) References Cited

U.S. PATENT DOCUMENTS

| | | | |
|---|---|---|---|
| 4,591,789 A | 5/1986 | Glover et al. ................ 324/307 |
| 4,721,914 A | * 1/1988 | Fukushima et al. .......... 324/320 |
| 5,023,554 A | 6/1991 | Cho et al. .................... 324/309 |
| 5,560,361 A | 10/1996 | Glusick ..................... 128/653.2 |
| 5,711,300 A | 1/1998 | Schneider et al. ........ 128/653.3 |
| 6,268,726 B1 | * 7/2001 | Prammer et al. ............ 324/303 |

OTHER PUBLICATIONS

A Readout Magnet for Prepolarized MRI, by Patrick Morgan, Steven Conolly, Greig Scott and Albert Macovski from the Magnetic Resonance Systems Research Laboratory Department of Electrical Engineering Stanford University, Stanford, California. Accepted May 10, 1996. MRM, vol. 36: pp. 527–536.

* cited by examiner

Primary Examiner—Edward Lefkowitz
Assistant Examiner—Brij B. Shrivastav
(74) Attorney, Agent, or Firm—Foley & Lardner; Peter J. Vogel; Michael A. Della Penna

(57) ABSTRACT

A magnetic resonant imaging apparatus having an operator console with input and output devices, a computer system for acquiring, processing and storing MRI images, and a system control device for generating and acquiring MRI image data. The magnetic resonant imaging apparatus comprises a table and a magnet assembly. An embodiment of the magnetic resonant imaging apparatus provides for the magnetic assembly to be positioned below the table. Another examplary embodiment of the magnetic resonant imaging apparatus provides for the magnetic assembly to be positioned at one end of the table and at the side of a table with the magnet assembly in a perpendicular aspect with respect to the table. The magnet assembly can be positioned with a partition member disposed between the table and the magnet assembly.

20 Claims, 3 Drawing Sheets

MAGNETIC RESONANCE IMAGING APPARATUS

FIELD OF THE INVENTION

The field of the invention is nuclear magnetic resonance imaging methods and systems. More particularly, the invention relates to MRI imaging systems equipped with a magnet assembly positioned under a table or at an end of the table.

BACKGROUND OF THE INVENTION

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is the x-y plane and which is near the Larmor frequency, the net aligned moment, $M_z$, may be rotated, or "tipped", into the x-y plane to produce a net transverse magnetic moment M. A signal is emitted by the excited spins after the excitation signal $B_1$ is terminated and this signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

In a typical magnetic resonant imaging (MRI) system, the magnets utilized have a donut shape structure. The opening or bore in the magnet structure receives the patient and patient table during the MRI scan. In some cases, either because of characteristics of the patient, such as the patient's size, or because of instruments and equipment that are attached to the patient, it is difficult or uncomfortable for the patient to be inserted into the bore of the magnets. Additionally, in some cases, a claustrophobic effect is experienced by the patient and result in difficulties in obtaining the MRI scan.

Thus there is a need for an MRI apparatus that provides a magnet assembly positioned either alongside the table or underneath the table that efficiently produces a sufficiently homogeneous magnetic field for imaging. There is also a need for MRI apparatus that uses an non-homogeneous pre-polarizing magnet in order to increase the signal to noise ratio associated with a homogeneous imaging magnet.

SUMMARY OF THE INVENTION

The present invention provides a method for obtaining an image of a selected portion of a subject of interest with a magnetic resonant imaging apparatus. The method comprises the steps of positioning a subject of interest within the magnetic field geometry of a magnet assembly, which includes an imaging magnet and energizing, rapidly, a polarizing electromagnet. The polarizing electromagnet is maintained in the energized mode for a pre-determined period of time and then rapidly de-energizing the polarizing electromagnet. Then an RF coil and gradient coil are energized to acquire the image. The methods can also include the steps of providing a table and positioning the magnet assembly below the table or positioning the magnet assembly, at one end of the table and a side of the table in a perpendicular aspect with respect to the table. A partition member can also be disposed between the patient table and the magnet assembly. The table can be a patient table.

The present invention also provides a magnetic resonant imaging apparatus having an operator console with input and output devices, a computer system for acquiring, processing and storing MRI images, and a system control device for generating and acquiring MRI image data. The magnetic resonant imaging apparatus comprises a patient table with a first electromagnet producing a polarizing magnetic field in a spaced apart relationship from the table, a second electromagnet producing an imaging magnetic field in a spaced apart relationship from the table and the first electromagnet, and magnetic gradient coils and RF coils disposed between the table and the first and second electromagnets and within geometry of the magnetic fields produced by the electromagnet. An examplary embodiment of the magnetic resonant imaging apparatus provides that the magnetic gradient coil for the x-axis and the magnetic gradient coil for the y-axis are energized. It also provides that the RF coil transmits and receives an RF pulse to obtain a magnetic resonant image of a subject of interest (SOI). Another embodiment of the magnetic resonant imaging system provides that the first and second electromagnets are solenoidal.

The present invention further provides a magnetic resonant imaging apparatus having an operator console with input and output devices, a computer system for acquiring, processing and storing MRI images, and a system control device for generating and acquiring MRI image data, with the magnetic resonant imaging apparatus comprising a means for supporting a subject of interest, a means for producing a polarized magnetic field in a spaced apart relationship from the means for supporting, a means for generating a magnetic field to produce an image of a subject of interest, with the means for generating in a spaced apart relationship from the means for supporting and the means for producing, and a means for emitting gradient magnetic fields and means for transmitting and receiving RF signals disposed between the means for supporting and the means for producing and the means for generating and within the magnetic fields produced by the means for producing and the means for generating.

Figure 1:
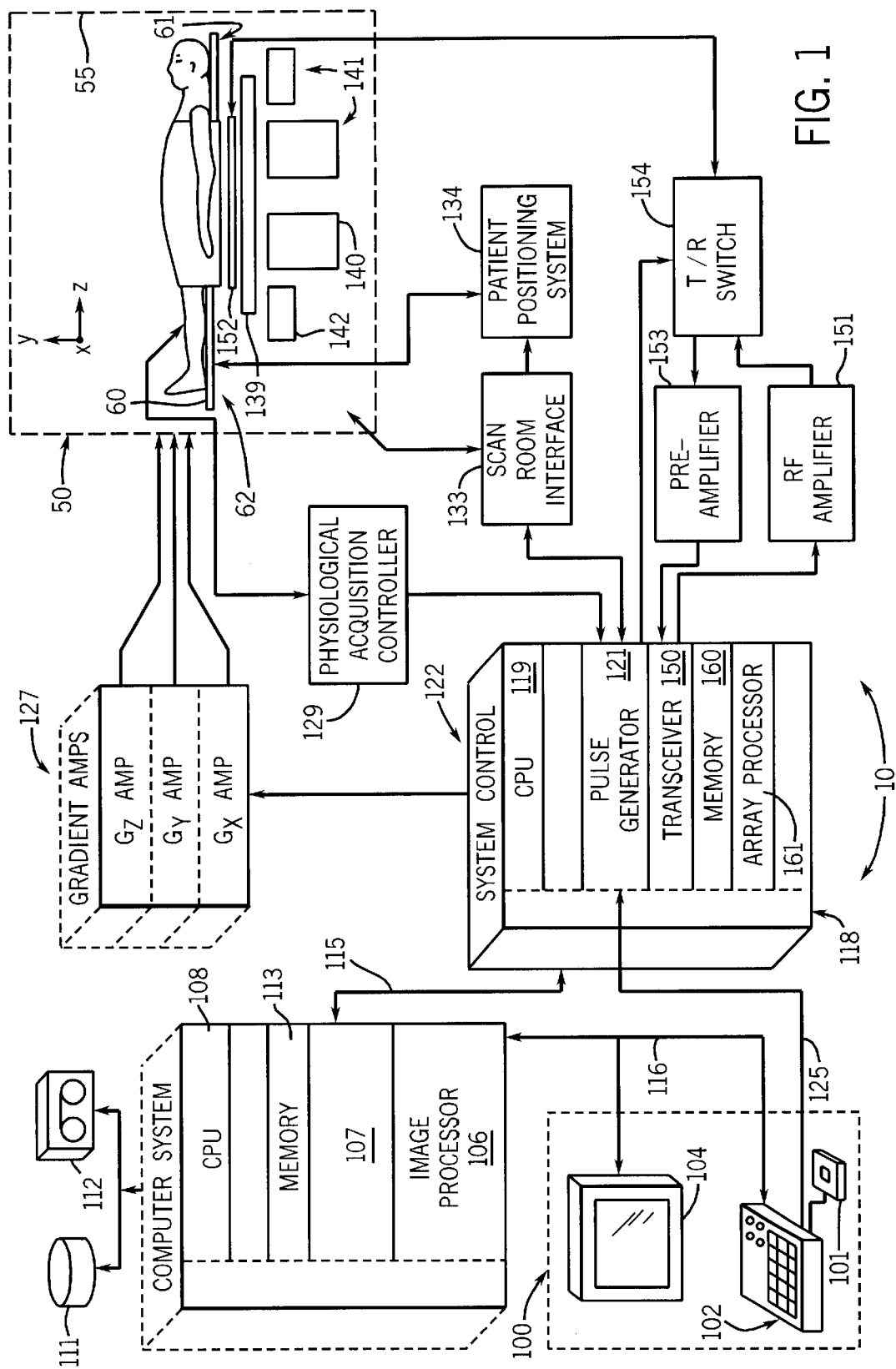
FIG. 1 is a block diagram of an examplary embodiment of a magnet resonant imaging apparatus illustrating the magnet assembly positioned below a patient table.

Before explaining examplary embodiments of the magnetic resonance imaging apparatus in detail it is to be understood that the invention is not limited in its application to the details of construction and the arrangement of the components set forth in the following description as illustrated in the drawings. The invention is capable of other embodiments or being practiced or carried out in various ways. Also, it is to be understood that the phraseology and terminology employed herein is for the purpose of description and should not be regarded as limiting.

DETAILED DESCRIPTION OF THE PREFERRED EMBODIMENTS

Referring first to FIG. 1, there is shown the major components of a preferred MRI system 10 which incorporates the present invention. The operation of the MRI system 10 is controlled from an operator console 100 which includes an input device 101, a control panel 102 and a display 104. The operator console 100 is usually located in a room separate from the scan room 50. The scan room 50 is a separate room having partition member 55 which separate the patient and magnet assembly 141 from the control console 100. Prior art typically provided for the patient and patient table to be placed inside a bore formed by the magnet assembly. The present magnetic resonance imaging apparatus places the patient and patient table 60 outside the magnet assembly 141, as will be explained below.

The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for position encoding acquired signals in the x-axis, y-axis and z-axis, respectively. The gradient coil assembly 139 forms part of a magnet assembly 141 which includes a polarizing electromagnet 140, an imaging magnet 142 and a whole-body RF coil 152. The imaging magnet 142 could be a permanent magnet or an electromagnet. If the imaging magnet 142 is an electromagnet, it must be energized as determined by the operator. In some instances, the electromagnet used for imaging may be energized continuously. In one embodiment of the present magnetic resonant imaging apparatus only the magnetic gradient coil for the x-axis and the magnetic gradient coil for the y-axis are energized.

A transceiver module 150 in the system control 122 produces pulses which are amplified by an RF amplifier 151 and coupled to the RF coil 152 by a transmit/receiver switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104.

Figure 2:
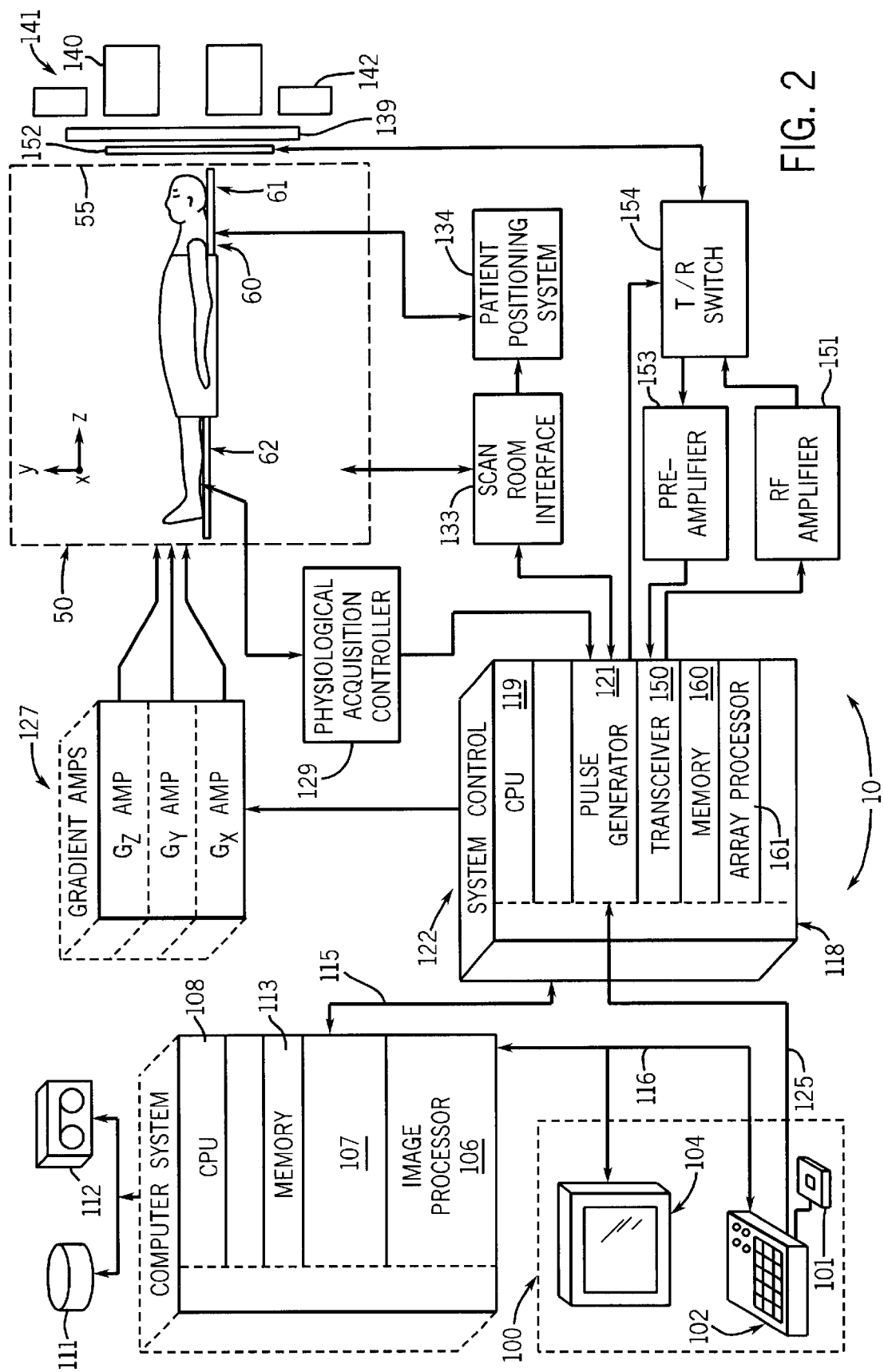
FIG. 2 is a block diagram of an examplary embodiment of a magnetic resonant imaging apparatus embodiment with the magnet assembly positioned at one end of a patient table with a partition member between the table and the magnet assembly.
Figure 3:
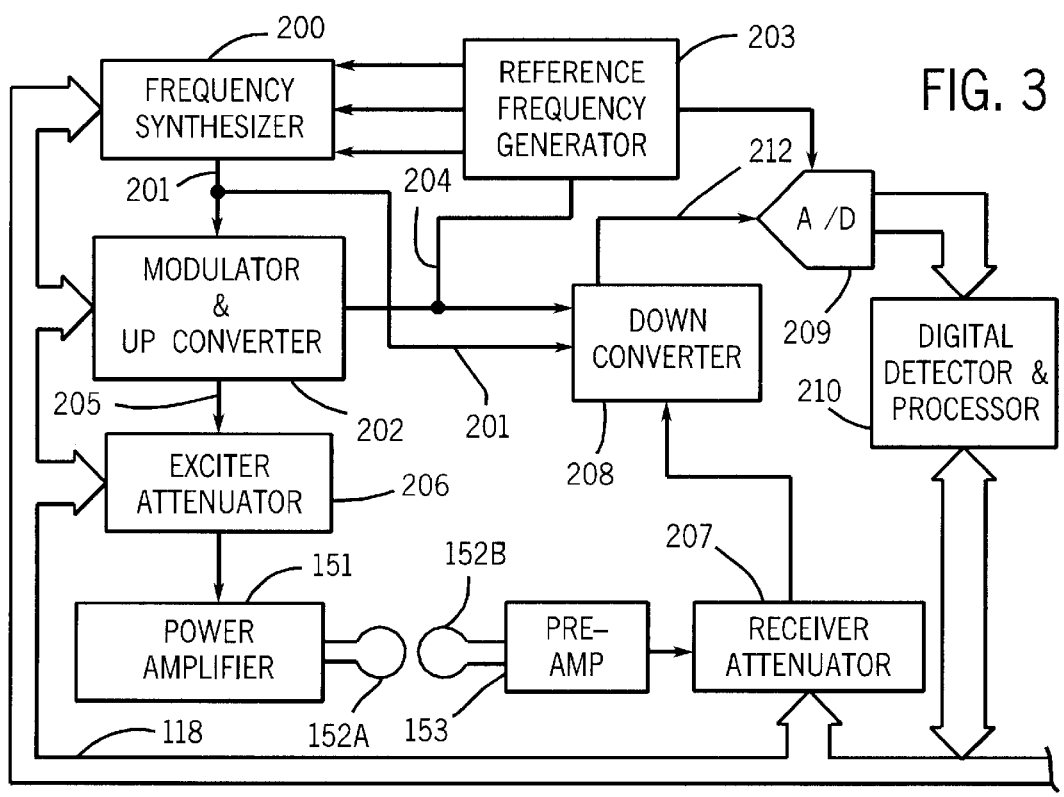
FIG. 3 is an electrical block diagram of the transceiver which forms part of the magnetic resonant imaging system of FIGS. 1 & 2.

Referring to FIGS. 1, 2, and 3, the transceiver 150 produces the RF excitation field B. through power amplifier 151 at a coil 152 and receives the resulting signal induced in a coil 152. As indicated above, the coil 152 may be separate, 152A, 152B as shown in FIG. 3, or they may be a single wholebody coil as shown in FIGS. 1 & 2. The base, or carrier, frequency of the RF excitation field is produced under control of a frequency synthesizer 200 which receives a set of digital signals (CF) from the CPU module 119 and pulse generator module 121. These digital signals indicate the frequency and phase of the RF carrier signal produced at an output 201. The commanded RF carrier is applied to a modulator and up converter 202 where its amplitude is modulated in response to a signal R(t) also received from the pulse generator module 121. The signal R(t) defines the envelope of the RF excitation pulse to be produced and is produced in the module 121 by sequentially reading out a series of stored digital values. These stored digital values may, in turn, be changed from the operator console 100 to enable any desired RF pulse envelope to be produced.

The magnitude of the RF excitation pulse produced at output 205 is attenuated by an exciter attenuator circuit 206 which receives a digital command, TA, from the backplane 118. The attenuated RF excitation pulses are applied to the power amplifier 151 that drives the RF coil 152.

Referring still to FIGS. 1, 2 and 3, the NMR signal produced by the subject is picked up by the receiver coil 152 and applied through the preamplifier 153 to the input of a receiver attenuator 207. The receiver attenuator 207 further amplifies the signal by an amount determined by a digital attenuation signal (RA) received from the backplane 118.

The received signal is at or around the Larmor frequency, and this high frequency signal is down converted with the carrier signal on line 201 by the down converter 208. The down converted NMR signal is applied to the input of an analog-to-digital (A/D) converter 209 which samples and digitizes the analog signal and applies it to a digital detector and signal processor 210 which produces 16 bit in-phase (I) values and 16-bit quadrature (Q) values corresponding to the received signal. The resulting stream of digitized I and Q values of the received signal are output through backplane 118 to the memory module 160 where they are normalized in accordance with the present invention and then employed to reconstruct an image.

To practice the present invention, an operator maneuvers a two dimensional scan plane through the structure of interest, typically an anatomical structure such as a joint or the head of a human being. Such maneuvering is accomplished from the operator console 100 using an input device 101. The input device 101 is selected from a group including a mouse, a joystick, a keyboard, a track ball, a touch screen and a light wand. The NMR system of the present invention utilizes a non-real-time MRI system.

The present invention provides an apparatus for producing an imaging plane of a structure of interest positioned in a MRI system. The image of the structure of interest is depicted on a display 104 of the operator console 100. The operator selects such image by using the input device 101 and interactively moving in real-time through planar sections of the structure of interest (SOI).

An examplary embodiment of a magnetic resonant imaging apparatus 10 having an operator console 100, an input 101 and output 104 devices, and a computer system 107 for acquiring, processing and storing MRI images, in a system control device 122 for generating and acquiring MRI image data comprises a table 60 which can be a patient table and a magnet assembly 141. The magnet assembly 141 can be positioned below the patient table 60 as shown in FIG. 1. The magnet assembly 141 can also be positioned at one end 61 of a patient table 60 and at a side 62 of a patient table as shown in FIG. 2. In the latter configuration the magnet assembly 141 is in a perpendicular aspect with respect to the patient table 60. The magnet assembly 141 can be aligned at any suitable and convenient angle relative to the patient table 60 that will produce the desired image.

The typical MRI imaging facility provides a scan room 50 that is composed of partition members 55 or walls that enclose the scan room 50. A typical configuration, the patient table 60 and the magnet assembly are located in the scan room 50 with the operator console 100, computer system 107 and system control device 122 located in an adjacent room. One embodiment of the present magnetic resonant imaging apparatus 10 is configured to have the magnet assembly 141 and the patient table 60 located in the scan room 50 as shown in FIG. 1. Another embodiment of the present magnetic resonant imaging apparatus 10 provides for the magnet assembly 141 to be located outside of the scan room 50 and separated from the patient table 60 by a partition 55 as shown in FIG. 2. It should be understood that FIG. 2 illustrates the magnet assembly 141 being at an end of the patient table 61 but it can also be at the side 62 of the patient table.

The magnetic assembly 141 comprises a first electromagnet 140 producing a polarizing magnetic field in a spaced apart relationship from the table, a second magnet 142 producing an imaging magnetic field in a spaced apart relationship from the table and the first electromagnet 140, and a magnetic gradient coil 139 and RF coil 152 disposed between the table 60 and the first and second magnets 140, 142 and within the geometry of the magnetic fields produced by the magnets. In a preferred embodiment of the magnetic resonant imaging apparatus 10 the second magnet 142 is an electromagnet and the first and second electromagnets 140, 142 are solenoidal. In a preferred embodiment of the magnetic resonant imaging apparatus 10 the magnetic gradient coil for the x-axis and the magnetic gradient coil for the y-axis are imbedded in the patient table 60 and are energized. A magnetic gradient coil for the z-axis is configured to produce a static z-gradient with the resulting image requiring a "grad-warp" which is a process for image distortion. The image distortion arising from such gradient and nonuniformity is corrected by determining a model of the gradient field nonuniformity, calculating the expected distortion in the image and applying a geometric correction to the imperfect image. The correction comprises displacing the spaced relationship of the pixels in the distorted image. This produces a corrected image which is a stretched or warped version of the original image. Specific details of this process are more fully defined in U.S. Pat. No. 4,591,789 assigned to the assignee of the present application.

In operation, a pre-polarized field is applied through the polarizing electromagnet 140 to the subject of interest (SOI). The pre-polarizing field is rapidly switched on, and held on for a predetermined time to polarize the spins to that corresponding to a field strength of at or about 0.5T, and then rapidly switched off. The imaging magnet 142 produces a read-out field of about 0.05T (50mT). If the imaging magnet 142 is an electromagnet, it may be continuously energized or intermittently energized as determined by the operator. The RF coil 152 transmits and receives an RF pulse to obtain the magnetic resonant imaging of SOI. With the readout field of 0.05T, the obtained RF pulse band width is in the 125 kHz range with minimal specific absorption ratio problems. The flat magnet configuration of the gradient coils 139 and not placing the patient table 60 in a bore of the polarizing and imaging magnets 140, 142 produces a small sufficiently homogeneous but open external magnetic field for imaging purposes. Since it is difficult to make a planar (under-the-table) magnet that efficiently produces a sufficiently strong and homogeneous magnetic field useful for imaging, the present invention provides an under-the-table or behind or in a wall magnet that produces a weak, but sufficient, homogeneous magnetic field for imaging an SOI. The present invention compensates for the diminished imaging magnet field strength by using a strong rapidly switched on and off pre-polarizing magnet. The pre-polarizing magnet can be fairly in-homogeneous as it is turned off during the imaging acquisition time. The typical application for the present system would be for joints and head area of a patient with the magnet assembly 141 positioned either underneath the patient table 60 or alongside the patient table 62 or at the head of the patient table 61 as determined by the operator of the magnetic resonant imaging apparatus 10.

A method for obtaining an image of a selected portion of a subject of interest, which can be a patient, with a magnetic resonant imaging apparatus 10 which can include an operator console 100 with input 101 and output 104 devices, a computer system 107 for acquiring, processing and storing MRI images, a system control device 122 for generating and acquiring MRI image data, a patient table 60 and a magnet assembly 141 comprises the steps of positioning a patient within the magnetic field geometry of the magnet assembly 141, which includes an imaging magnet 142. The operator then energizes, rapidly, a polarizing electromagnet 140. The operator would maintain the polarizing electromagnet 140 in the energized mode for a predetermined period of time sufficient to polarize the spins of the SOI that correspond to the selected field strength selected by the operator. Then the operator de-energizes rapidly the polarizing electromagnet 140. The operator also energizes an RF coil 142 and energizes the gradient coil 139 to acquire the selected image. As mentioned above, the magnet assembly 141 can be positioned below a table 60 which can support a patient during a medical imaging procedure, or one end of the table 60 or side 62 of the table 60 in a substantially perpendicular aspect with respect to the table 60. A partition member 55 can be disposed between the table 60 and the magnet assembly 141. It should also be noted that the gradient coils 139 can be either under the table, above the table or around the patient.

Thus, there is provided a magnetic resonant imaging apparatus having a patient table with a magnet assembly positioned either underneath the table or at the side or head of the table. Although the invention has been described in conjunction with specific embodiments thereof, it is evident that many alternatives, modifications and variations will be apparent to those ordinarily skilled in the art. For example, the gradient coils in the x, y and z axis may be imbedded in the partition of the scan room or they may be nested within each other in a table or the partition member 55. The magnet assembly may be configured for portability by mounting on a suitable transport device for aligning the magnet assembly alongside or at an end of the subject of interest or adjacent to the subject of interest to be imaged. The magnet assembly can be in a split double magnet configuration to provide for an interventional space between the magnet portions to allow an intervention procedure such as a biopsy to be performed on a patient guided by the MRI image produced by the magnetic resonant imaging apparatus. Fast spin echo sequences can also be used with the present magnetic resonant imaging apparatus to improve efficiency and lessen imaging times. Accordingly, it is intended to embrace all such alternatives, modifications and variations that fall within the spirit and scope of the appended claims.

What is claimed is:

1. A method for obtaining an image of a selected portion of a subject of interest with a magnetic resonance imaging apparatus, the method comprising the steps of;

positioning the subject of interest within the magnetic field geometry of a magnet assembly including a constantly energized, inhomogeneous imaging magnet with a field gradient along the z-axis;

providing a polarizing electromagnet to produce a ion-homogeneous magnetic field;

energizing, rapidly, the polarizing electromagnet;

maintaining the polarizing electromagnet in the energized mode for a predetermined period of time;

de-energizing rapidly, the polarizing electromagnet, energizing an RF coil;

energizing x and y gradient coils; and, acquiring signal and constructing the image.

2. The method of claim 1, including the step of providing a table to support the subject of interest.

3. The method of claim 2, including the step of positioning the magnet assembly below the table.

4. The method of claim 2 positioning the magnet assembly, at one of an end of the table and a side of the table in a perpendicular aspect with respect to the table.

5. The method of claim 4, including the step of providing a partition member disposed between the table and the magnet assembly.

6. The method of claim 2, wherein the table is a patient table.

7. A magnetic resonance imaging apparatus having an operator console with input and output devices, a computer system for acquiring, processing and storing MRI images, and a system control device for generating and acquiring MRI image data, the magnetic resonance imaging apparatus comprising:

a patient table;

a first electromagnet producing a non-homogeneous polarizing magnetic field in a spaced apart relationship from the table;

a second magnet producing a constantly energized inhomogeneous imaging magnetic field with a gradient along the z-axis in a spaced apart relationship from the table and the first electromagnet; and, magnetic x and y gradient coils and RF coils disposed within the geometry of the magnetic fields produced by the first and second magnets.

8. The magnetic resonant imaging apparatus of claim 7, wherein, the magnetic gradient coil for the x-axis and the magnetic gradient coil for the y-axis are energized.

9. The magnetic resonant imaging apparatus of claim 8, wherein the RF-coil transmits and receives an RF pulse to obtain a magnetic resonance image of a SOI.

10. The magnetic resonant imaging apparatus of claim 7, wherein the second magnet is an electromagnet.

11. The magnetic resonant imaging apparatus of claim 10, wherein the first and second electromagnets are solenoidal.

12. The magnetic resonant imaging apparatus of claim 11, wherein the electromagnets and the RF coils are positioned below the patient table.

13. The magnetic resonant imaging apparatus of claim 11 wherein the electromagnets, and RF coils are positioned, at one of an end of the patient table and a side of the patient table, in a perpendicular aspect with respect to the patient table.

14. The magnetic resonant imaging apparatus of claim 13 including a partition member disposed between the patient table and the electromagnets and RF coils.

15. A magnetic resonance imagine apparatus having an operator console with input and output devices, a computer system for acquiring, processing and storing MRI images, and a system control device for generating and acquiring MRI image data, the magnetic resonance imaging apparatus comprising:

a means for supporting a subject of interest;

a means for producing a non-homogeneous polarized magnetic field in a spaced apart relationship from the means for supporting;

a means for generating a constant energized inhomogeneous magnetic field with a gradient along the z-axis to produce an image of a subject of interest with the means for generating in a spaced apart relationship from the means for supporting and the means for producing; and, means for emitting gradient magnetic fields along a x-axis and a y-axis and means for transmitting and receiving RF signals disposed between the means for supporting and the means for producing and the means for generating, and within the magnetic fields produced by the means for producing and the means for generating.

16. The magnetic resonant imaging apparatus of claim 15, wherein, the means for emitting gradient field for the x-axis and the means for emitting gradient field for the y-axis are energized.

17. The magnetic resonant imaging apparatus of claim 16, wherein the means for producing and the means for generating are solenoidal.

18. The magnetic resonant imaging apparatus of claim 17, wherein the means for producing, the means for generating, the means for emitting and the means for transmitting and receiving are positioned below the means for supporting.

19. The magnetic resonant imaging apparatus of claim 17 wherein the means for producing, the means for generating, the means for emitting and the means for transmitting and receiving are positioned at one of an end of the means for supporting and a side of the means for supporting, in a substantially perpendicular aspect to the means for supporting.

20. The magnetic resonant imaging apparatus of claim 19 including a partition member disposed between the means for supporting and the means for producing, the means for generating, the means for emitting and the means for transmitting and receiving.

\* \* \* \* \*

UNITED STATES PATENT AND TRADEMARK OFFICE
CERTIFICATE OF CORRECTION

PATENT NO.    : 6,462,544 B1
DATED         : October 8, 2002
INVENTOR(S)   : Graeme McKinnon It is certified that error appears in the above-identified patent and that said Letters Patent is hereby corrected as shown below:

<u>Column 7,</u>
Line 45, delete the word "ion" and insert the word -- non --.

<u>Column 8,</u>
Line 41, delete the word "imagine" and insert the word -- imaging --.

Signed and Sealed this

Sixth Day of May, 2003

JAMES E. ROGAN
*Director of the United States Patent and Trademark Office*

UNITED STATES PATENT AND TRADEMARK OFFICE
CERTIFICATE OF CORRECTION

PATENT NO.   : 6,462,544 B1                                     Page 1 of 1
DATED        : October 8, 2002
INVENTOR(S)  : Graeme McKinnon It is certified that error appears in the above-identified patent and that said Letters Patent is hereby corrected as shown below:

<u>Title page,</u>
Item [*] Notice:, change "by 0 days" to -- "by 15 days" --.

Signed and Sealed this

Twenty-sixth Day of August, 2003

JAMES E. ROGAN
*Director of the United States Patent and Trademark Office*